(12) United States Patent
Chou et al.

(10) Patent No.: US 8,710,676 B2
(45) Date of Patent: Apr. 29, 2014

(54) STACKED STRUCTURE AND STACKED METHOD FOR THREE-DIMENSIONAL CHIP

(75) Inventors: Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 231 days.

(21) Appl. No.: 12/986,184

(22) Filed: Jan. 7, 2011

(65) Prior Publication Data
US 2012/0146207 A1 Jun. 14, 2012

(30) Foreign Application Priority Data
Dec. 8, 2010 (TW) .............................. 99142845 A

(51) Int. Cl.
*H01L 25/16* (2006.01)
*H01L 21/50* (2006.01)

(52) U.S. Cl.
USPC ............ 257/777; 257/621; 257/686; 257/774; 257/E23.131; 257/E23.169; 257/E23.174; 257/E25.029

(58) Field of Classification Search
USPC .................. 257/621, 686, 774, 777, E23.131, 257/E23.169, E23.174, E25.029
See application file for complete search history.

(56) References Cited

U.S. PATENT DOCUMENTS

| 6,385,074 | B1 | 5/2002 | Johnson et al. |
| 6,492,727 | B2 | 12/2002 | Nishizawa et al. |
| 7,158,220 | B2 | 1/2007 | Zhang |
| 7,276,799 | B2 | 10/2007 | Lee et al. |
| 2005/0189639 | A1* | 9/2005 | Tanie et al. ................... 257/686 |
| 2007/0023887 | A1* | 2/2007 | Matsui .......................... 257/686 |
| 2008/0111582 | A1* | 5/2008 | Matsui et al. ................. 326/39 |

FOREIGN PATENT DOCUMENTS

| TW | I237272 | 8/2005 |
| TW | I249238 | 2/2006 |
| TW | 200822310 | 5/2008 |

OTHER PUBLICATIONS

"Office Action of Taiwan Counterpart Application", issued on Sep. 24, 2013, p. 1-p. 5, in which the listed references were cited.

* cited by examiner

*Primary Examiner* — Peniel M Gumedzoe
(74) *Attorney, Agent, or Firm* — Jianq Chyun IP Office

(57) ABSTRACT

A stacked structure and a stacked method for a three-dimensional integrated circuit are provided. The provided stacked method includes separating a logic chip into a function chip and an I/O chip; stacking the function chip above the I/O chip; and stacking at least one memory chip between the function chip and the I/O chip.

14 Claims, 5 Drawing Sheets

STACKED STRUCTURE AND STACKED METHOD FOR THREE-DIMENSIONAL CHIP

CROSS-REFERENCE TO RELATED APPLICATION

This application claims the priority benefit of Taiwan application serial no. 99142845, filed on Dec. 8, 2010. The entirety of the above-mentioned patent application is hereby incorporated by reference herein and made a part of this specification.

1. Technical Field

The disclosure relates to a three-dimensional integrated circuit. Particularly, the disclosure relates to stacked structure and method of logic and memory chips.

2. Background

In a conventional two-dimensional (2D) system on chip (SoC), as shown in FIG. 1, a memory 103 (for example, a cache memory, a static random access memory (SRAM), or a dynamic random access memory (DRAM)) is generally located on the same plane with a logic unit 101 (for example, a central processing unit (CPU), a digital signal processor (DSP), or a graphic processing unit (GPU)), and the logic unit 101 accesses (i.e. reads/writes) the memory 103 through an internal bus.

The memory may occupy a large area of the SoC. Based on an estimation made by the International Technology Roadmap for Semiconductors (ITRS) in 2003, in a low-power SoC, the memory can occupy more than 50% of the whole area of the SoC. In order to ensure that the SoC can effectively use the memory, to provide a sufficiently large bandwidth of the bus in the SoC becomes an important issue.

In a three-dimensional (3D) chip, various types of chips can be stacked vertically. There are two stacking methods thereof according to disclosures/instructions of published documents:

1. The logic and memory are disposed on the same chip for stacking, as shown in FIG. 2A.
2. The logic and memory are disposed in different chips for stacking, as shown in FIG. 2B.

According to FIG. 2A, it is clearly seen that the logic unit A and the memory A are disposed in the same chip, and are stacked with the logic unit B and the memory B disposed in the same chip. However, since the stacking method of the 3D chip of FIG. 2A still applies a concept of a 2D design, interconnections between the logic units and the memories cannot use through silicon vias (TSVs) with advantages of short delay and high accessing bandwidth, so that the performance is about equivalent to or even worse than the SoC for the die stacking incurs extra area overhead and heat dissipation penalty.

On the other hand, according to FIG. 2B, it is clearly seen that the logic unit A and the memory A are disposed in different chips, and are stacked with the logic unit B and the memory B disposed in different chips. By disposing the memories right above the logic units, the interconnections between the logic units and the memories can effectively take advantages of the TSVs, so as to greatly increase the bandwidth of the memory and improve the performance of the SoC.

However, the logic unit may consume significant power during a high-speed operation. Therefore, when the temperature of the logic unit rises and become a high heat source due to high-speed operations, the memory is directly baked by the high-temperature logic unit, so that reliability of the memory is degraded since regardless of SRAM or the DRAM, the standby current thereof increases exponentially with temperature.

Moreover, a high-speed logic unit (for example, a CPU) generally often has an extremely high operating temperature and a large number of pins. Generally, a thermal design power (TDP) is used to indicate a basic heat dissipation condition of the logic unit; i.e., a cooling system has to at least satisfy the rated value of the TDP in order to ensure a normal operation of the logic unit (CPU). For high-end CPU products in the market, the TDPs thereof are likely greater than 70W.

Moreover, considering a flip-chip package, two conclusions are deduced below.

1. If the memory is disposed above the logic unit, the backside of the logic unit (for example, CPU) cannot be directly mounted to an external heat sink, so that the logic unit cannot operate normally. In other words, the TDP of the logic unit cannot be too high, which also means that its performance is greatly limited. The TDP of the memory does not exceed 5W which is significantly different from that of the logic unit with high performance.
2. If the memory is disposed under the logic unit, external heat sink could be directly mounted to the backside of the logic unit to achieve cooling, although a large number of pins of the logic unit requires a large number of TSVs to go through the memory, which incurs significant area overhead in the memory. Moreover, the TSVs cannot be arbitrarily planted in the memory but have to maintain the regularity of cell array on the memory.

Therefore, the stacking method to resolve the issues of heat dissipation and high pin count for the logic unit while maintaining the integrity of the memory is still under development.

SUMMARY

Accordingly, an exemplary of the disclosure provides a stacked structure for a 3D chip, where the logic chip is divided into (or formed by) two chips: a function chip and an input/output (I/O) chip, and the function chip is stacked above the I/O chip. The stacked structure also includes a first memory chip, which is stacked between the function chip and the I/O chip.

An exemplary of the disclosure provides a stacked method for a 3D chip. The provided stacked method includes separating the logic chip into a function chip and an I/O chip; stacking the function chip above the I/O chip; and stacking at least one memory chip between the function chip and the I/O chip.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
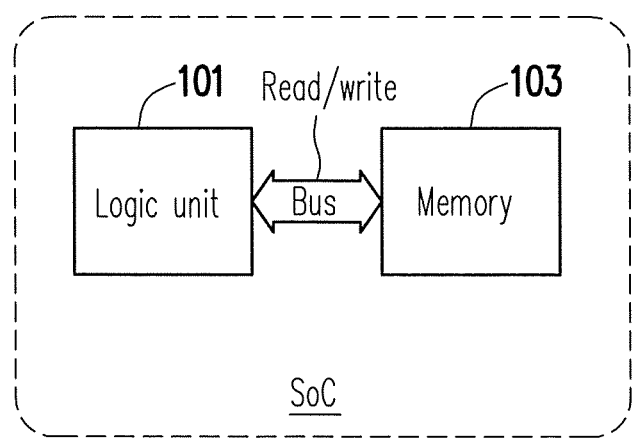
FIG. 1 is a schematic diagram of a conventional two-dimensional (2D) system on chip (SoC).
Figure 2A:
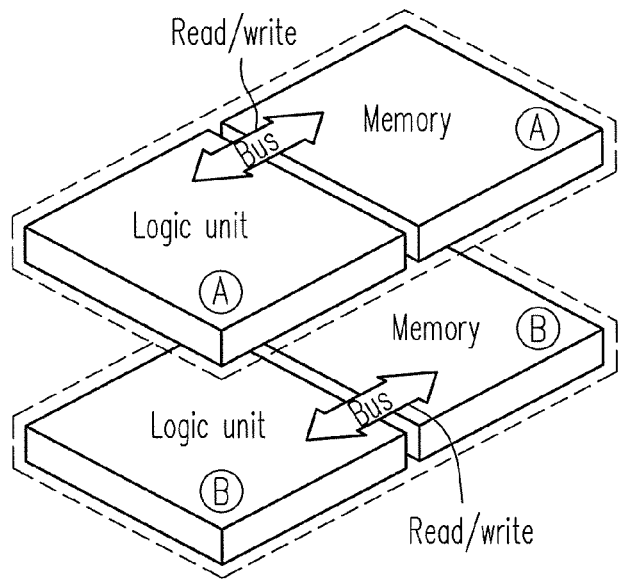
FIG. 2A and FIG. 2B are schematic diagrams illustrating conventional stacking methods of two chips with logic and memory being on the same chip and on two different chips.
Figure 2B:
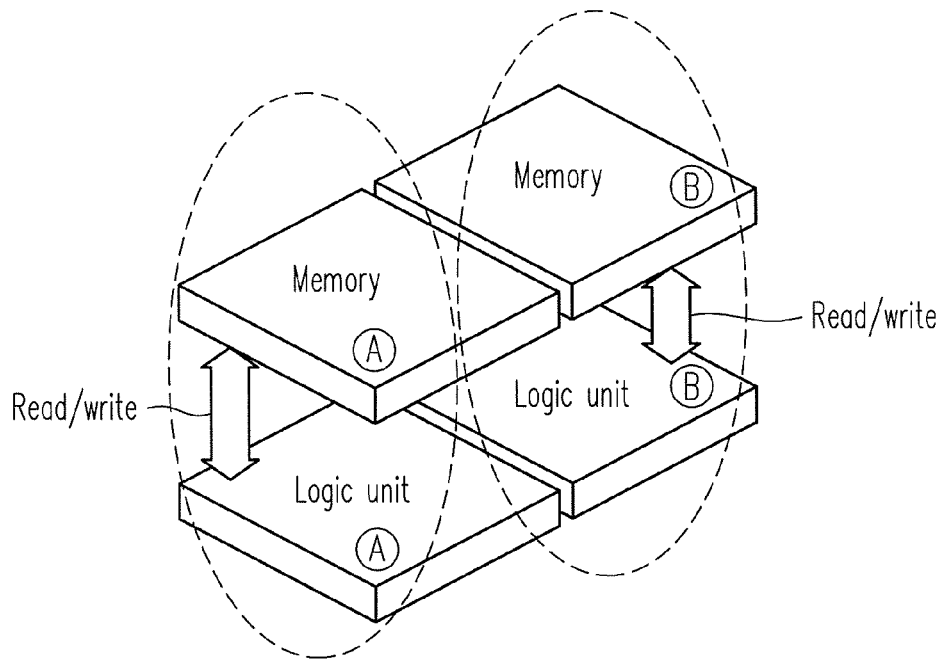

Reference is now made in detail to the present preferred embodiments of the disclosure, examples of which are illustrated in the accompanying drawings. Wherever possible, the same reference numbers are used in the drawings and the descriptions to refer to the same or like parts.

Figure 3:
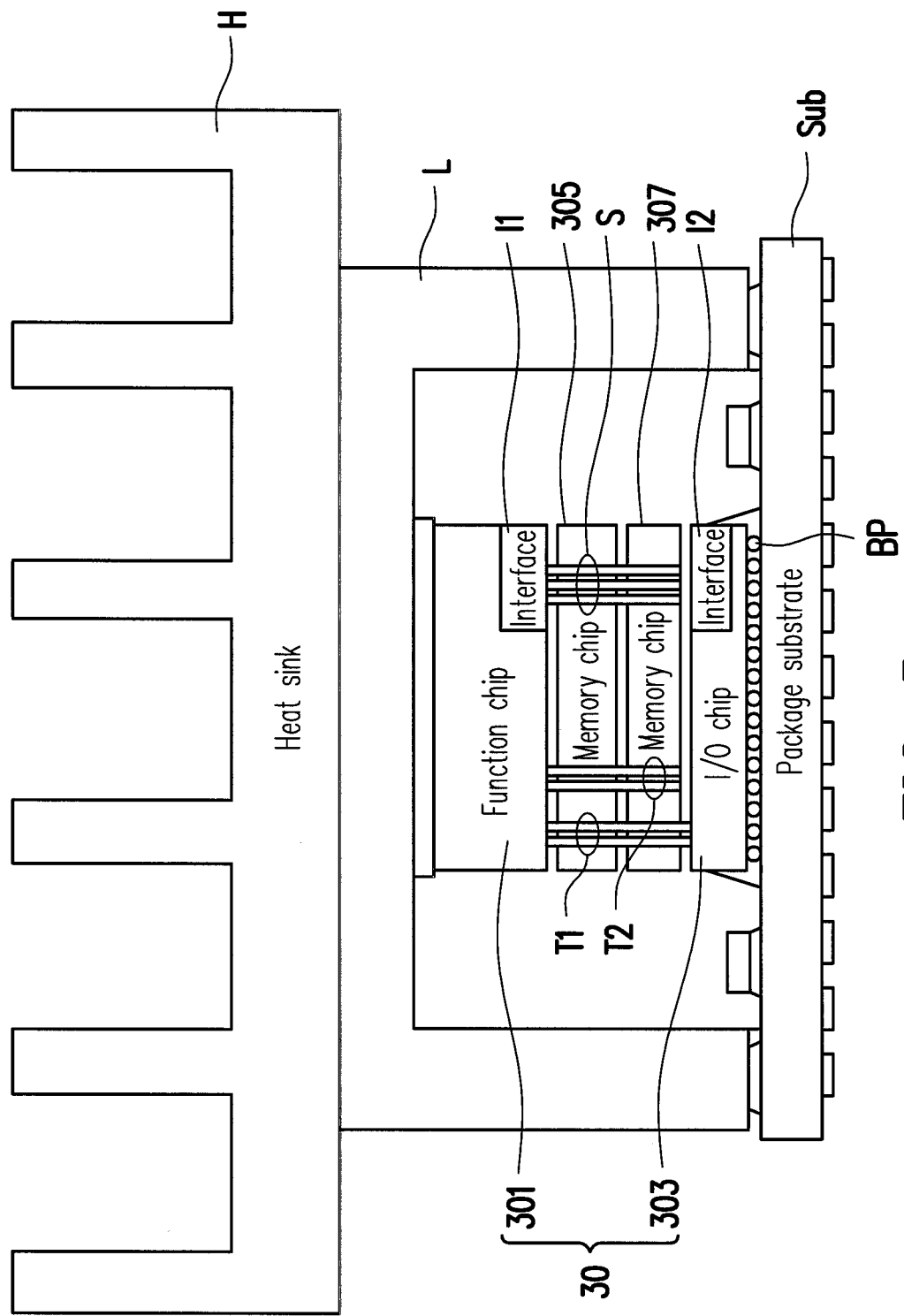
FIG. 3 is a schematic diagram of a stacked structure of a three-dimensional (3D) chip according to an exemplary embodiment of the disclosure.

FIG. 3 is a schematic diagram of a stacked structure of a three-dimensional (3D) chip according to an exemplary embodiment of the disclosure. Referring to FIG. 3, the stacked structure of the 3D chip of the present exemplary embodiment includes a logic chip 30 and at least one memory chip (two memory chips 305 and 307 are schematically illustrated in FIG. 3, though the disclosure is not limited thereto), where the logic chip 30 is divided into (or formed by) a function chip 301 and an input/output (I/O) chip 303; i.e., in the present exemplary embodiment, a single logic chip is deliberately separated into two interdependent chips respectively in charge of core functions and input/output operations. Moreover, the logic chip 30 could be a processor of any type (for example, a central processing unit (CPU), a digital signal processor (DSP), or a graphic processing unit (GPU)), and the memory chips 305 and 307 can each be a static random access memory (SRAM), a dynamic random access memory (DRAM), or other read-write memory, though the disclosure is not limited thereto, and the memory chips 305 and 307 can also be cache memories.

According to FIG. 3, it is clearly seen that the function chip 301 is stacked above the I/O chip 303, and the memory chips 305 and 307 are stacked between the function chip 301 and the I/O chip 303. In detail, the function chip 301, the I/O chip 303 and the memory chips 305 and 307 are vertically stacked. The memory chip 305 is stacked between the function chip 301 and the I/O chip 303 and is located closer to the function chip 301, and the memory chip 307 is stacked between the memory chip 305 and the I/O chip 303.

On the other hand, the function chip 301 and the I/O chip 303 are communicated through a serial transmission mode. In detail, the function chip 301 and the I/O chip 303 can respectively convert parallel data into a serial mode through serial interfaces I1 and I2 thereof, and vertically transmit data through a high speed (for example, 20 GHz, though the disclosure is not limited thereto) serial connection mode.

In the present exemplary embodiment, according to the serial connection mode, an internal signal can be encoded into a serial signal format or the serial signal format can be decoded through the serial interfaces I1 and I2. Assuming that the function chip 301 and the I/O chip 303 communicate through a synchronous serial transmission mode, the function chip 301 and the I/O chip 303 can communicate through at least three signal lines S, namely, master out/slave in (MOSI), master in/slave out (MISO) and system clock (SCLK). Where, the function chip 301 can be regarded as a master device, and the I/O chip 303 can be regarded as a slave device, and data communication/transmission between the function chip 301 and the I/O chip 303 can be implemented through the respective serial interfaces I1 and I2.

It should be noticed that each signal line S between the function chip 301 and the I/O chip 303 could be implemented by through silicon via (TSV). Moreover, some lines S between the function chip 301 and the I/O chip 303 could be used as serial signal lines, and the rest of lines S could be used as power lines. The assignment of each of the lines S between the function chip 301 and the I/O chip 303 could be determined according to an actual design requirement, so that it is not limited to that all lines S between the function chip 301 and the I/O chip 303 could only be used as the serial signal lines.

However, in other exemplary embodiments, the function chip 301 and the I/O chip 303 can also be communicated through an asynchronous serial transmission mode, which is determined according to an actual design requirement. Therefore, based on the mechanism/means of high-speed serial connection mode, a total number of TSVs passing through the memory chips 305 and 307 can be greatly reduced, so that the area overhead to each of the memory chips 305 and 307 is not increased significantly.

In the present exemplary embodiment, the function chip 301, the I/O chip 303 and the memory chips 305 and 307 could be packaged according to a flip chip package technique. In this way, the function chip 301 and the I/O chip 303 face downwards to the package substrate Sub, and the backside of the function chip 301 is on the top. Therefore, a large number of balls can be connected to a package substrate Sub to form external contacts (i.e., serving as external pins of the 3D chip) through a plurality of conductive bumps BP electrically connected to the face of the I/O chip 303. Moreover, after a lid L is attached, the backside of the function chip 301 and a package material (e.g., a low-modulus thermal compound) may form a heat dissipation surface. In this way, as long as a heat sink H is disposed above/on the 3D chip (i.e. the heat sink H is connected to the lid L), a heat dissipation path of the 3D chip is completed/formed, so that the logic chip 30 can operate normally, and the reliability of the 3D chip is improved.

On the other hand, in the present exemplary embodiment, the function chip 301 and the memory chip 305 could be stacked according to a face-to-face stacking method, or stacked according to a face-to-back stacking method. Moreover, the two memory chips 305 and 307 could be stacked through the face-to-back staking method. However, the stacking method of the function chip 301 and the two memory chips 305 and 307 could be determined according to an actual design requirement.

After the function chip 301, the I/O chip 303, and the memory chips 305 and 307 are vertically stacked, the I/O chip 303 could transmit power (VDD/VSS) to the function chip 301 through a plurality of TSVs T1. Moreover, the I/O chip 303 can also transmit the power to the memory chips 305 and 307 through the same TSVs T1; i.e., the function chip 301 and the memory chips 305 and 307 can share the TSVs T1 used for power distribution. However, in other exemplary embodiments, signals could be transmitted between the I/O chip 303 and the function chip 301 through other TSVs T1. In other words, data with low transmission rate can be transmitted between the I/O chip 303 and the function chip 301 through a part of the TSVs T1. The assignment of each of the TSVs T1 between the I/O chip 303 and the function chip 301 is determined according to an actual design requirement, so that it is not limited to that all of the TSVs T1 between the I/O chip 303 and the function chip 301 could only be used to transmit the power (VDD/VSS).

Moreover, the function chip 301 can access the memory chips 305 and 307 through a large amount of TSVs T2 passing through the memory chips 305 and 307. Therefore, interconnections between the function chip 301 and the two memory chips 305 and 307 are implemented through the TSVs T2 taking advantages of short delay and high bandwidth. In this way, accessing efficiency of the memories and computation/operation speed of the 3D chip (which can also be treated as a system on chip (SoC)) can be greatly improved. However, in other exemplary embodiments, other TSVs T2 could be used to transmit the power (VDD/VSS) between the function chip 301 and the memory chips 305 and 307. A function of each of the TSVs T2 between the function chip 301 and the memory chips 305 and 307 is determined according to an actual design requirement, so that it is not limited to that all of the TSVs T2 between the function chip 301 and the memory chips 305 and 307 could only be used to access the memory chips 305 and 307.

According to the above descriptions, it is known that the high performance function chip 301 can still maintain the heat dissipation path for effectively dissipating the heat, so that the logic chip 30 can operate normally. Moreover, the memory chips 305 and 307 are located under the function chip 301 having the heat dissipation path, so that reliability degradation of the memory chips 305 and 307 caused by high temperature could be effectively controlled. Moreover, it should be noticed that with reference of actual products and document recording, the number of control signals is as many as several hundred, and the operating frequency thereof is not higher than 4 GHz. The data transmission of serial connection mode used by the present exemplary embodiment may at least reach 20 Gb/s. With a suitable coding and design, a very few serial connections can afford the signal transmission of the logic chip 30, and besides the TSVs used for accessing the memory chips 305 and 307, the other TSVs can be greatly decreased to a basic need of power transmission.

Figure 4:
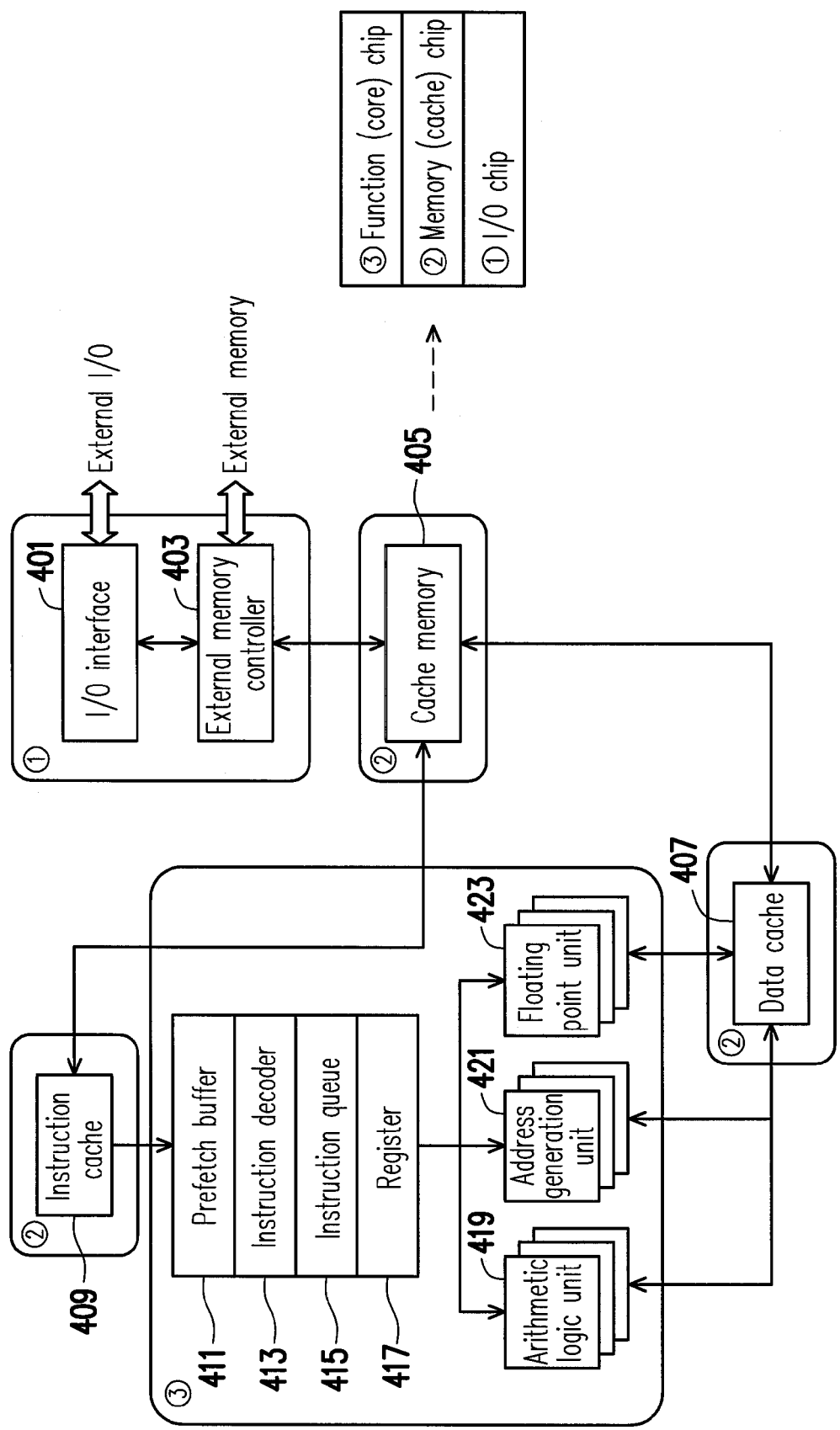
FIG. 4 is a schematic diagram illustrating an application of a 3D chip according to an exemplary embodiment of the disclosure.

FIG. 4 is a schematic diagram illustrating an application of a 3D chip according to an exemplary embodiment of the disclosure. Referring to FIG. 4, the 3D chip of the present exemplary embodiment is a CPU, though the disclosure is not limited thereto, and the 3D chip includes an I/O interface 401, an external memory controller 403, a cache memory 405, a data cache 407, an instruction cache 409, a prefetch buffer 411, an instruction decoder 413, an instruction queue 415, a register 417, a plurality of arithmetic logic units (ALUs) 419, a plurality of address generation units (AGUs) 421 and a plurality of floating point units (FPUs) 423.

According to the disclosures/instructions of the aforementioned exemplary embodiment, the I/O interface 401 and the external memory controller 403 could be grouped into an I/O chip ①, the cache memory 405, the data cache 407 and the instruction cache 409 could be grouped into a memory (cache) chip ②, and the prefetch buffer 411, the instruction decoder 413, the instruction queue 415, the register 417, the ALUs 419, the AGUs 421 and the FPUs 423 can be grouped into a function (core) chip ③. Moreover, when the I/O chip ①, the memory (cache) chip ② and the function (core) chip ③ are stacked, the function (core) chip ③, the memory (cache) chip ② and the I/O chip ① could be vertically stacked from top to bottom, so that the memory (cache) chip ② is stacked between the function (core) chip ③ and the I/O chip ①. In this way, the 3D chip (CPU) of the present exemplary embodiment may have technical functions similar to that of the aforementioned exemplary embodiment.

Figure 5:
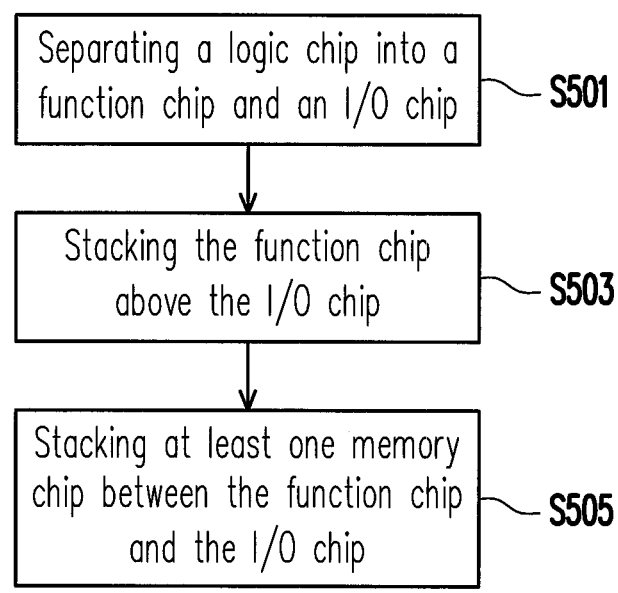
FIG. 5 is a flowchart illustrating a stacked method of a 3D chip according to an exemplary embodiment of the disclosure.

According to the disclosures/instructions of the aforementioned exemplary embodiments, FIG. 5 is a flowchart illustrating a stacked method of a 3D chip according to an exemplary embodiment of the disclosure. Referring to FIG. 5, the stacked method of the 3D chip of the present exemplary embodiment includes following steps. A logic chip is separated into a function chip and an I/O chip (step S501). The function chip is stacked above the I/O chip (step S503). At least one memory chip is stacked between the function chip and the I/O chip (step S505).

In summary, in the disclosure, a single logic chip is separated into an I/O chip related to I/O operations and a function chip with operations other than I/O. Moreover, the I/O chip and the function chip may convert parallel data into a serial mode through serial interfaces, so as to vertically transmit the data through a high-speed serial connection mode. In addition, all of the memory chips are disposed/stacked between the I/O chip and the function chip, so as to achieve a 3D chip formed by stacking the logic chip and the memory chips. Since the number of TSVs passing through the memory chips could be greatly reduced by using the high-speed serial connection mode, the area overhead to the memory chip is minimized, and the reliability of the 3D chip is improved. Furthermore, the function chip, the I/O chip and the memory chips can be packaged using a flip chip package technique, so that the packaged 3D chip still maintains the preferred heat dissipation path and high pin count.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A stacked structure of a three-dimensional (3D) chip, comprising:
   a function chip which is at least capable of performing arithmetic computation;
   an input/output (I/O) chip which is stacked below the function chip and performs input/output operations of the 3D chip to an external world; and
   a first memory chip, stacked between the function chip and the I/O chip,
   wherein the function chip and the I/O chip communicate by a serial transmission mode, the function chip and the I/O chip respectively convert data into a serial signal format by serial interfaces, and vertically transmit the data to each other through a signal line.

2. The stacked structure of the 3D chip as claimed in claim 1, wherein serial transmission mode comprises a synchronous serial transmission mode or an asynchronous serial transmission mode.

3. The stacked structure of the 3D chip as claimed in claim 1, wherein the function chip and the first memory chip are stacked according to a face-to-face stacking method.

4. The stacked structure of the 3D chip as claimed in claim 1, wherein the function chip and the first memory chip are stacked according to a face-to-back stacking method.

5. The stacked structure of the 3D chip as claimed in claim 1, further comprising:
   a second memory chip, stacked between the first memory chip and the I/O chip.

6. The stacked structure of the 3D chip as claimed in claim 5, wherein the first memory chip and the second memory chip are stacked according to a face-to-back stacking method.

7. The stacked structure of the 3D chip as claimed in claim 5, wherein the I/O chip transmits power to the function chip through a plurality of through silicon vias (TSVs).

8. The stacked structure of the 3D chip as claimed in claim 7, wherein the I/O chip further transmits power to the first and the second memory chips through the TSVs.

9. The stacked structure of the 3D chip as claimed in claim 5, wherein the function chip accesses the first and the second memory chips through a plurality of TSVs.

10. The stacked structure of the 3D chip as claimed in claim 5, wherein the function chip, the I/O chip and the first and the second memory chips are packaged according to a flip chip package technique.

11. The stacked structure of the 3D chip as claimed in claim 10, further comprising:
 a heat sink, disposed above the 3D chip for dissipating heat of the 3D chip.

12. The stacked structure of the 3D chip as claimed in claim 10, further comprising:
 a plurality of bumps, electrically connected to the I/O chip to serve as external pins of the 3D chip.

13. The stacked structure of the 3D chip as claimed in claim 5, wherein a logic chip is formed by the function chip and the I/O chip,
 wherein the logic chip is a processor, and the first and the second memory chips are respectively a static random access memory or a dynamic random access memory.

14. A stacked method for a three-dimensional chip, comprising:
 functionally dividing a logic chip into a function chip and an I/O chip and providing the function chip and the I/O chip, wherein the logic chip is at least capable of performing arithmetic computation and logic operations through the function chip;
 stacking the function chip above the I/O chip, wherein the I/O chip performs input/output operations to an external world; and
 stacking at least one memory chip between the function chip and the I/O chip, wherein the memory chip communicate to the function chip and the I/O chip,
 wherein the function chip and the I/O chip communicate by a serial transmission mode, the function chip and the I/O chip respectively convert data into a serial signal fonnat by serial interfaces, and vertically transmit the data to each other through a signal line.

* * * * *